United States Patent

Bonn et al.

[11] Patent Number: 6,160,280
[45] Date of Patent: *Dec. 12, 2000

[54] FIELD EFFECT TRANSISTOR

[75] Inventors: Fred H. Bonn, Chandler; George B. Norris, Phoenix; John Michael Golio, Chandler, all of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/610,504

[22] Filed: Mar. 4, 1996

[51] Int. Cl.⁷ .......................... H01L 29/80; H01L 31/112
[52] U.S. Cl. .......................... 257/272; 257/192; 257/194
[58] Field of Search ...................... 455/333, 323, 455/325, 326, 319, 209, 318, 311, 313, 330; 327/408, 404, 416, 356, 113; 257/368, 365, 369, 256, 270, 272, 280, 281, 285, 286, 287, 404, 194, 192

[56] References Cited

U.S. PATENT DOCUMENTS

| | | | |
|---|---|---|---|
| 4,635,088 | 1/1987 | Eguchi | 257/365 |
| 4,870,478 | 9/1989 | Weitzel et al. | |
| 5,077,589 | 12/1991 | Holm et al. | |
| 5,304,825 | 4/1994 | Vaitkus et al. | |
| 5,324,969 | 6/1994 | Murai et al. | 257/279 |
| 5,325,000 | 6/1994 | Birkeland et al. | |
| 5,339,459 | 8/1994 | Schlitz et al. | |
| 5,482,875 | 1/1996 | Vaitkus et al. | |
| 5,528,769 | 6/1996 | Berenz et al. | 455/333 |
| 5,551,076 | 8/1996 | Bonn | 455/333 |
| 5,726,467 | 3/1998 | Nakagawa | 257/192 |

Primary Examiner—Steven H. Loke
Assistant Examiner—Thien F. Tran
Attorney, Agent, or Firm—A. Kate Huffman; Sharon K. Coleman

[57] ABSTRACT

A field effect transistor structure which can serve as a low noise amplifier. The field effect transistor has a major surface and source and drain regions extending from the major surface into a body of semiconductor material. A channel region is formed in a portion of the body of semiconductor material separating the source and drain regions. The channel region has a first boundary perpendicular to the major and contiguous with the source region, a second boundary parallel to the first boundary and contiguous with the drain region, a third boundary perpendicular to the first boundary, and a fourth boundary parallel to the channel region. A first portion of the channel region is enclosed by a first border parallel to the first boundary of the channel region, a second border parallel to the second boundary of the channel region, a third boundary of the channel region, and the fourth boundary of the channel region. A non-conductive section is formed in the body of semiconductor material extending from the major surface and enclosed by a first edge coinciding with the first border of the first portion of the channel region, a second edged coinciding with the second border of the first portion of the channel region, a third edge parallel to the third boundary of the channel region, and a fourth edge parallel to the fourth boundary of the channel region. A gate structure is formed above the first portion of the channel region.

12 Claims, 6 Drawing Sheets

FIELD EFFECT TRANSISTOR

BACKGROUND OF THE INVENTION

The present invention relates, in general, to semiconductor circuits and, more particularly, to semiconductor downconverters.

Downconverters are used in radio applications to convert a signal of one frequency to a signal of another frequency. A downconverter typically includes a low noise amplifier (LNA), an image filter, and a mixer circuit. The LNA amplifies a radio frequency (RF) signal which is filtered through the image filter and mixed with a local oscillator (LO) signal in the mixer circuit. The mixing process provides a mixed signal, which has a spectrum comprised of the sum and difference of the frequencies of the RF and LO signals. The higher frequency components in the mixed signal are filtered out leaving an intermediate frequency (IF) component which serves as the output signal of the downconverter. To prevent the RF circuitry and the LO circuitry from interacting with each other, the mixer circuit may use a dual gate field effect transistor or two field effect transistors in a cascode configuration to mix the RF and LO signals.

A common problem with a downconverter is the need to individually supply the low noise amplifier and the mixing transistor with sufficient current for operation. For example, the low noise amplifier and mixing transistor may each require two to three milli-amps of operating current. Circuitry that consumes current at this level may not be suitable for portable applications such as cellular telephones, digital pagers, etc.

Another problem with a downconverter occurs when the mixer circuit is switched off. While the mixer circuit is off, the LO signal may have sufficient power to turn on the mixing transistor in the mixer circuit. A switching circuit in the LO signal path is typically used to block the LO signal from the gate of the mixing transistor during the off period to ensure that the mixing transistor is switched off. However, the switching circuit increases the complexity of the mixer circuit and the size of the integrated circuit chip.

Accordingly, it would be advantageous to have a downconverter and a method for generating an IF signal. It is desirable for the downconverter to have a low power consumption. It would be of further advantage for the downconverter to be fabricated using a minimum chip area.

DETAILED DESCRIPTION OF THE DRAWINGS

Figure 1:
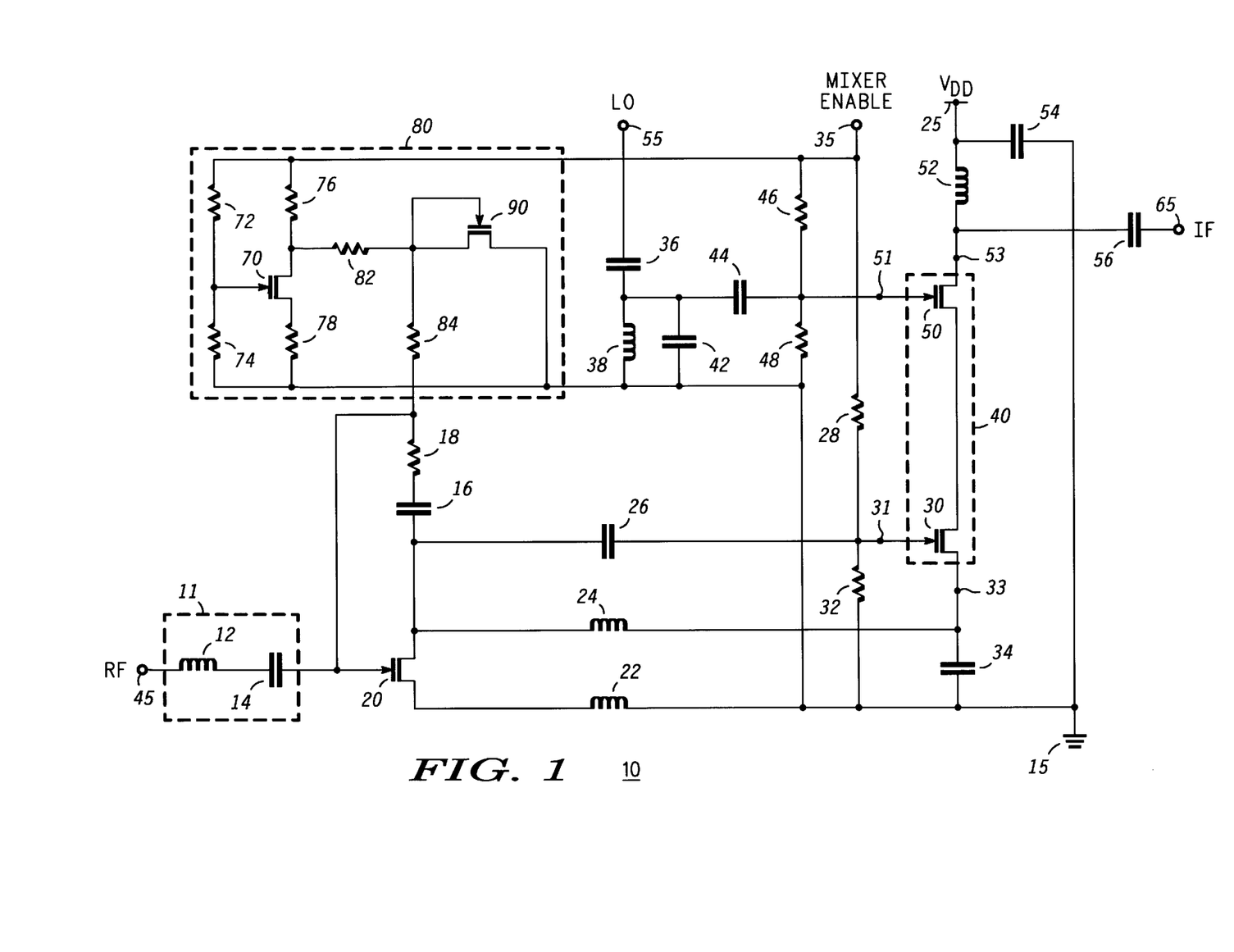
FIG. 1 is a schematic diagram of a downconverter in accordance with an embodiment of the present invention.

FIG. 1 is a schematic diagram of a downconverter 10 in accordance with an embodiment of the present invention. Downconverter 10 combines a radio frequency (RF) signal and a local oscillator (LO) signal to provide an intermediate frequency (IF) signal. Downconverter 10 includes a field effect transistor (FET) 20 which serves as a low noise amplifier (LNA) for amplifying the RF signal. A gate electrode of FET 20 is coupled for receiving the RF signal at an RF port 45 via serially coupled inductor 12 and capacitor 14. Inductor 12 and capacitor 14 cooperate to form an impedance matching element 11 for providing a desired impedance, e.g., 50 ohms (Ω), at RF port 45. An impedance matching element is also referred to as an impedance transformer. A source electrode of FET 20 is coupled to a power supply conductor 15 via an inductor 22. In the embodiment shown in FIG. 1, power supply conductor 15 operates at ground potential. Inductor 22 provides a direct current (DC) path from the source electrode of FET 20 to power supply conductor 15 and adjusts the noise characteristics of the LNA by altering its impedance. A drain electrode of FET 20 is coupled to the gate electrode of FET 20 via serially coupled capacitor 16 and resistor 18, which establish a negative feedback loop for FET 20. Although FET 20 is shown as being coupled in a feedback configuration via capacitor 16 and resistor 18, it should be understood that capacitor 16 and resistor 18 are optional. Likewise, inductor 22 is also optional. In other words, capacitor 16 and resistor 18 may be absent from downconverter 10 and the source electrode of FET 20 may be coupled to power supply conductor 15 directly or via a resistor.

Still referring to FIG. 1, the gate electrode of FET 20 is coupled to a voltage source 80 which includes a FET 70 and a diode connected FET 90, which are referred to as voltage source transistors. More particularly, the gate electrode of FET 20 is connected to a first electrode of a resistor 84. A second electrode of resistor 84 is connected to a drain electrode of FET 90. The drain electrode of FET 90 is coupled to a drain electrode of FET 70 via a resistor 82. Further, the drain electrode of FET 90 is connected to a gate electrode of FET 90, thereby configuring FET 90 as a diode connected FET. A source electrode of FET 90 is coupled to a source electrode of FET 70 via a resistor 78 and to a gate electrode of FET 70 via a resistor 74. In addition, the source electrode of FET 90 is connected to power supply conductor 15, which is preferably at ground. The gate electrode of FET 70 is coupled to a voltage supply conductor 35 via a resistor 72. Likewise, the drain electrode of FET 70 is coupled to voltage supply conductor 35 via a resistor 76. By way of example, voltage supply conductor 35 is connected to a mixer enable signal.

It should be understood that voltage source 80 is not limited to the structure shown in FIG. 1. The gate electrode of FET 20 can be biased by other suitable biasing circuits. Preferably, the circuit that biases the gate electrode of FET 20 compensates for voltage variations that may be caused by temperature and transistor threshold voltage variations, and has a minimum power consumption.

Downconverter 10 also includes a mixer 40 which comprises FETs 30 and 50 coupled in a cascode configuration and serving as mixer transistors. A drain electrode of FET 30 is connected to a source electrode of FET 50. A gate electrode of FET 30 serves as a first gate terminal 31 of mixer 40. A gate electrode of FET 50 serves as a second gate terminal 51 of mixer 40. The first and second gate terminal are also referred to as first and second control terminals, respectively, of mixer 40. A source electrode of FET 30 serves as a source terminal 33 of mixer 40. A drain electrode of FET 50 serves as a drain terminal 53 of mixer 40. The source and drain terminals of mixer 40 are also referred to as first and second current conducting terminals, respectively, of mixer 40.

In an alternative embodiment, mixer 40 includes a dual gate FET. A first gate of the dual gate FET serves as first gate terminal 31 of mixer 40 and a second gate of the dual gate FET serves as second gate terminal 51 of mixer 40. A source of the dual gate FET serves as source terminal 33 of mixer 40 and a drain of the dual gate FET serves as drain terminal 53 of mixer 40. It should be noted that the cascode and dual gate embodiments of mixer 40 prevent the RF circuitry and the LO circuitry from interacting with each other.

First gate terminal 31 is coupled to power supply conductor 15 via a resistor 32 and to voltage supply conductor 35 via a resistor 28. First gate terminal 31 is also coupled to the drain electrode of FET 20 via a capacitor 26. Capacitor 26 provides a high impedance for blocking DC signal to first gate terminal 31 of mixer 40 and functions as an impedance matching element between the drain of FET 20 and first gate terminal 31 of mixer 40.

Second gate terminal 51 is coupled to power supply conductor 15 via a resistor 48 and to voltage supply conductor 35 via a resistor 46. In addition, second gate terminal 51 is connected to a first electrode of capacitor 44. A second electrode of capacitor 44 is coupled to power supply conductor 15 via parallel connected capacitor 42 and inductor 38. Further, the second electrode of capacitor 44 is coupled to an LO port 55 via a capacitor 36 for receiving an LO signal. Capacitors 36, 42, and 44 and inductor 38 cooperate to form an impedance matching element for providing a desired input impedance, e.g., 50 Ω, at LO port 55.

Source terminal 33 of mixer 40 is coupled to the drain electrode of FET 20 via an inductor 24 and is coupled to power supply conductor 15 via a capacitor 34. Drain terminal 53 of mixer 40 is coupled to an IF port 65 via a capacitor 56 and to a power supply conductor 25 via an inductor 52. Power supply conductor 25 operates at a supply voltage VDD and is further coupled to power supply conductor 15 via a capacitor 54. Capacitors 54 and 56 and inductor 52 cooperate to form an impedance transformer for providing a desired impedance, e.g., 50 Ω, at IF port 65. Furthermore, capacitor 54 provides an alternating current (AC) path from power supply conductor 25 to power supply conductor 15.

Preferably, FETs 20, 30, 50, 70, and 90 are gallium arsenide FETs. However, it should be understood that this is not a limitation of the present invention and that they can be replaced by insulated gate FETs, bipolar transistors, etc. As those skilled in the art are aware, the gate electrode of a FET serves as a control electrode, and the source and drain electrodes of the FET serve as current conducting electrodes. Likewise, the base electrode of a bipolar transistor serves as a control electrode, and the emitter and collector electrodes of the bipolar transistor serve as current conducting electrodes.

In operation, inductor 52, mixer 40, inductor 24, FET 20, and inductor 22 form a DC path from $V_{DD}$ at power supply conductor 25 to ground at power supply conductor 15. Thus, downconverter 10 routes the operating current from the conduction path of mixer 40 to the conduction path of FET 20 via inductor 24. By re-using the supply current from mixer 40 to operate FET 20, downconverter 10 reduces the power consumption compared with prior art downconverters. Inductor 24 provides a high impedance between the drain electrode of FET 20 and source terminal 33 of mixer 40 for blocking the RF and LO signals to source terminal 33 of mixer 40. Inductor 24 also serves to match the impedance at the drain electrode of FET 20 to the impedance at first gate terminal 31 of mixer 40; provide image filtering of the amplified signal of FET 20; and provide a low frequency path from the drain electrode of FET 20 to power supply conductor 15 via capacitor 34 for the IF noise components generated by FET 20. In an alternative embodiment, a resistor may be used in place of inductor 24 for blocking the RF and LO signals.

The current flowing from power supply conductor 25 to power supply conductor 15 is typically in the range of two to three milli-amps. The current flowing from voltage supply conductor 35 to power supply conductor 15 is determined by the resistors in voltage source 80 and gate biasing resistors of mixer 40 and is typically in the range of 200 micro-amps. In order to increase the switching speed of the mixer enable signal at voltage supply conductor 35, power supply conductor 25 is preferably uncoupled from voltage supply conductor 35. However, this is not a limitation of the present invention. In an alternative embodiment, power supply conductor 25 is coupled to voltage supply conductor 35 and controlled by the mixer enable signal.

Figure 2:
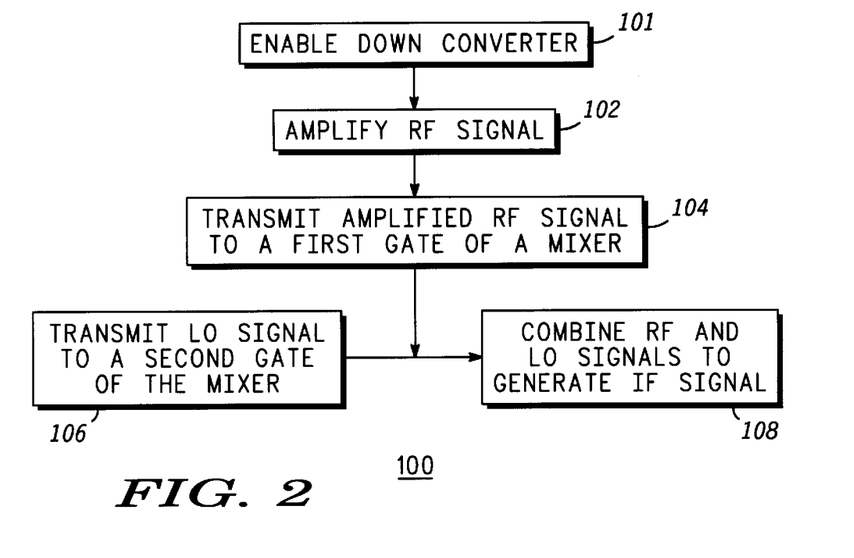
FIG. 2 is a flow chart of a method for generating an intermediate frequency signal in accordance with another embodiment of the present invention.

FIG. 2 is a flow chart 100 of a method for generating an IF signal using downconverter 10 of FIG. 1 in accordance with another embodiment of the present invention. Simultaneously referring to FIGS. 1 and 2, downconverter 10 is enabled by a high voltage level, e.g., $V_{DD}$, at voltage supply conductor 35 (step 101). Voltage source 80 biases the gate electrode of FET 20, which is turned on. Mixer 40 is enabled via biasing resistors 28 and 32 coupled to first gate terminal 31 and biasing resistors 46 and 48 coupled to second gate terminal 51.

The RF signal at RF port 45 is transmitted to the gate electrode of FET 20 via the impedance matching element formed by inductor 12 and capacitor 14. FET 20 functions as an LNA and amplifies the RF signal (step 102). Capacitor 16 and resistor 18 transmit a negative feedback signal from the drain of FET 20 to its gate. Inductor 22 provides a DC path from the source electrode of FET 20 and adjusts the noise characteristics of the LNA by altering its impedance.

The amplified RF signal appears at the drain electrode of FET 20 and is transmitted to first gate terminal 31 of mixer 40 via capacitor 26 (step 104). Capacitor 26 provides DC blocking as well as impedance matching between the drain electrode of FET 20 and first gate terminal 31 of mixer 40. Inductor 24 blocks the amplified RF signal to source terminal 33 of mixer 40. The LO signal is transmitted to second gate terminal 51 of mixer 40 via the impedance matching element formed by capacitors 36, 42, and 44, and inductor 38 (step 106).

Mixer 40 combines the RF signal and the LO signal and generates the IF signal at drain terminal 53 (step 108). The IF signal is transmitted to IF port 65 via capacitor 56. Capacitor 34 provides an AC path from source terminal 33 of mixer 40 to ground at power supply conductor 15. Capacitor 54 provides an AC path from power supply conductor 25 to power supply conductor 15, e.g., from $V_{DD}$ to ground.

Both mixer 40 and FET 20 use the current which travels in the DC path from power supply conductor 25, through inductor 52, mixer 40, inductor 24, FET 20, and inductor 22, to power supply conductor 15. Therefore, the power consumption of downconverter 10 is significantly smaller than that of a prior art downconverter in which the LNA and the mixer are coupled in parallel between the supply voltage and ground.

Inductors 22, 24, and 52 block the transmission of AC signals through the DC path. Furthermore, capacitor 34 shunts the AC signal from source terminal 33 of mixer 40 to ground. Thus, the operation of FET 20 is not affected by the RF signal, the LO signal, and their intermodulation products which appear at source terminal 33 of mixer 40.

Downconverter 10 is disabled by setting the mixer enable signal at voltage supply conductor 35 to a low voltage level near ground potential, thereby placing the gate of FET 20, the first gate terminal 31 and second gate terminal 51 of mixer 40 near ground potential. Thus, FET 20 and mixer 40 are switched off. In the disabled mode, the potential at second gate terminal 51 of mixer 40 is sufficiently low that the LO signal does not have sufficient power to turn on mixer 40 and generate an IF signal at IF port 65. In addition, the conduction path of mixer 40 and the conduction path of FET 20 are serially coupled between $V_{DD}$ and ground. Thus, FET 20, which is switched off, prevents a current from flowing through the conduction path of mixer 40, thereby ensuring that mixer 40 does not generate an output signal. Therefore, downconverter 10 does not require a switching circuit in the LO signal path.

As described with reference to FIG. 1, mixer 40 includes FETs 30 and 50 in a cascode configuration or includes a dual gate FET. The two embodiments have identical circuit functions which are mixing the RF and LO signals to generate the IF signal and isolating the RF circuitry from the LO circuitry. In the cascode configuration, FET 30 preferably has a smaller current conducting capacity than that of FET 50 to prevent FET 50 from being driven into current saturation by a strong RF signal that may appear at the gate electrode of FET 30.

It should be noted that a dual gate FET uses less area than two FETs in a cascode configuration. Furthermore, the performance of a dual gate FET is less affected by process and thermal variations than the performance of two FETs in the cascode configuration. In order to prevent mixer 40 from being driven into current saturation by a strong RF signal that may appear at first gate terminal 31 of mixer 40, the current conducting capacity of the channel under the first gate of the dual gate FET is preferably smaller than the current conducting capacity of the channel under its second gate. The current conducting capacity of a channel in a FET is controllable by adjusting the gate width corresponding to the channel. Therefore, a dual gate FET having two gates of different widths has different current conducting capacities in the channels under its two gates.

In order to provide different current conducting capacities under different gates of the dual gate FET in downconverter 10, a multi-gate FET structure with independently adjustable gate widths and channel properties is developed. The conduction channel under each gate of the multi-gate FET has individually variable channel width and channel properties, such as dopant concentration, channel depth, etc. The channel width under a gate is also referred to as the gate width. A version of the multi-gate FET structure, the dual gate FET with independently adjusted gate widths, is used as mixer 40 of downconverter 10 shown in FIG. 1.

Figure 3:
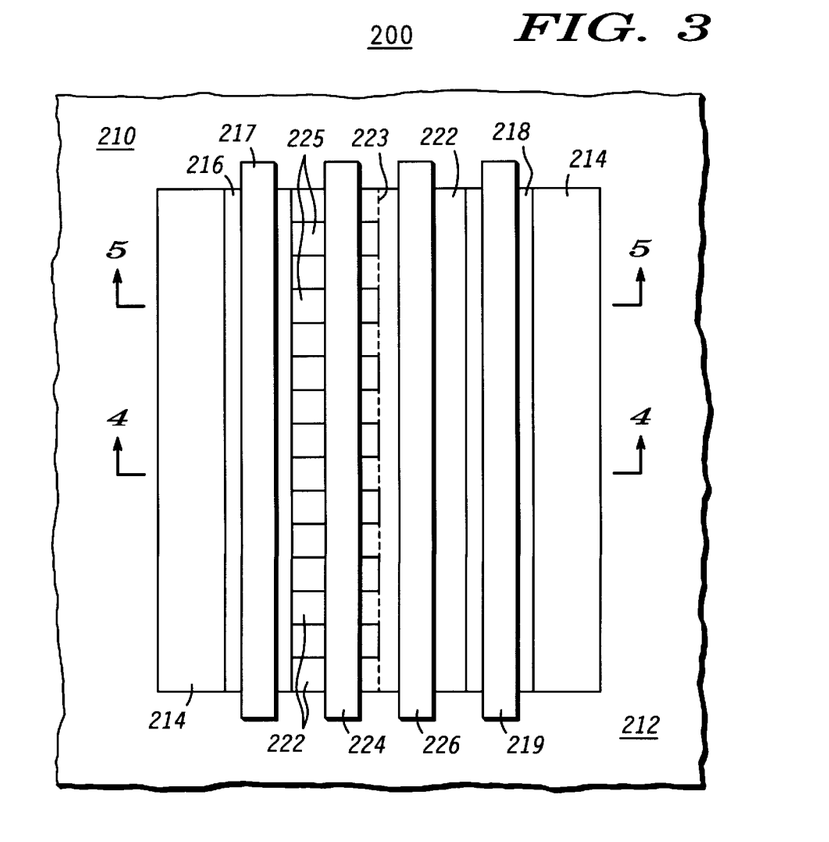
FIG. 3 is a top view of a field effect transistor structure in accordance with yet another embodiment of the present invention.

FIG. 3 is a top view of a field effect transistor structure 200 in accordance with yet another embodiment of the present invention. Structure 200 includes a body of semiconductor material or substrate 210 having a major surface 212. An impurity well 214 extends into substrate 210 from major surface 212. By way of example, substrate 210 is semi-insulating gallium arsenide and impurity well 214 is a gallium arsenide semiconductor of p-type conductivity. Impurity well 214 has a dopant concentration typically on the order of $10^{14}$ to $10^{16}$ atoms per cubic centimeter (atoms/$cm^3$) and extends into substrate 210 to a depth of about 0.1 to about 0.6 microns ($\mu$m). Impurity well 214 serves to improve the confinement of a channel region 222. It should be noted that, although preferred, impurity region 214 is optional in structure 200.

Structure 200 further includes a source region 216 and a drain region 218 extending from major surface 212 into impurity well 214 to a junction depth of, for example, 0.1 $\mu$m to 0.5 $\mu$m. Source region 216 and drain region 218 typically have an n-type dopant concentration on the order of $10^{18}$ to $10^{19}$ atoms/$cm^3$. A source electrode 217 is formed above source region 216 and a drain electrode 219 is formed above drain region 218.

Channel region 222 separates source region 216 from drain region 218. By way of example, channel region 222 is a gallium arsenide semiconductor of n-type conductivity, has a dopant concentration typically on the order of $10^{16}$ to $10^{18}$ atoms/$cm^3$, and extends into substrate 210 to a channel depth of about 0.1 $\mu$m to about 0.3 $\mu$m. A distance from source region 216 to drain region 218 is referred to as channel length of channel region 222. In the direction of the channel length, channel region 222 is confined by two boundaries which are perpendicular to major surface 212 and contiguous with source region 216 and drain region 218. A dimension of channel region 222 in the direction perpendicular to the direction of the channel length is referred to as the channel width of channel region 222. In the direction of the channel width, channel region 222 is confined by two boundaries which are perpendicular to major surface 212 and coinciding with the boundaries of impurity well 214.

Channel region 222 is partitioned into two portions. A first portion of channel region 222 is referred to as a first gate region and a second portion of channel region 222 is referred to as a second gate region. Each gate region is enclosed by two boundaries of channel region 222 in the direction of the channel width and by two borders in the direction of the channel length. The first border of the first gate region is contiguous with source region 216. The second border of the first gate region and the first border of the second gate region coincide with each other and are represented by a border line 223. The second border of the second gate region is contiguous with drain region 218.

A plurality of non-conductive sections, each having a reference number 225, are formed in the first gate region. In the direction of the channel length, non-conductive sections 225 are confined by two edges coinciding with the two borders of the first gate region. In the direction of the channel width, each non-conductive section 225 is confined by two edges perpendicular to border line 223. A dimension of non-conductive section 225 in the direction of the channel width is referred to as the width of non-conductive section 225. Therefore, the first gate region is partitioned into a plurality of conducting channels separated from each other by non-conductive sections 225. A first gate structure 224 and a second gate structure 226 are then formed on major surface 212 above the first gate region and the second gate region, respectively.

Figure 4:
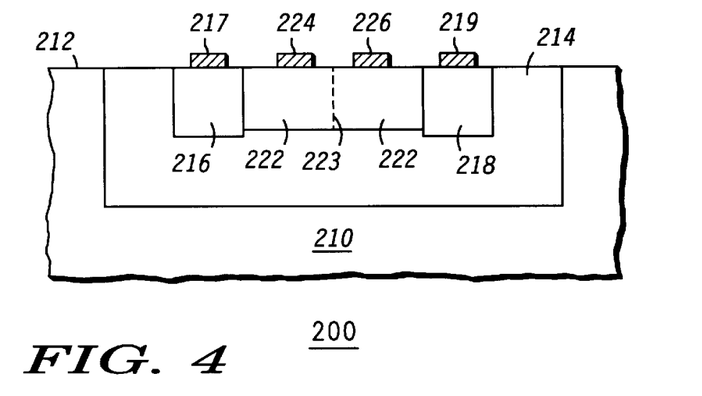
FIG. 4 is a cross-sectional view along section line 4—4 of FIG. 3.
Figure 5:
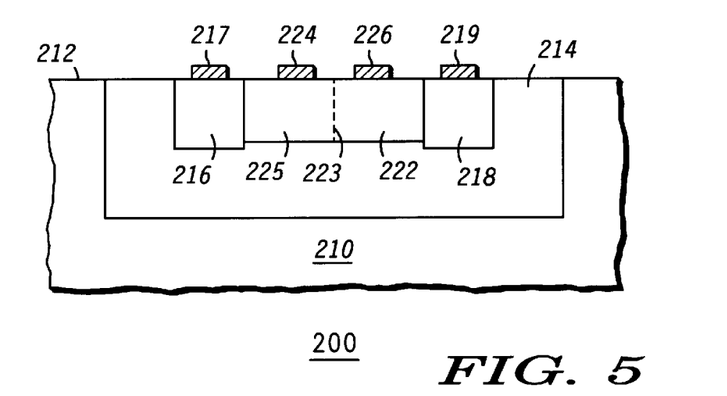
FIG. 5 is a cross-sectional view along section line 5—5 of FIG. 3.

Simultaneously referring to FIGS. 4 and 5, which are cross-sectional views of FET structure 200 along section line 4—4 and section line 5—5, respectively, of FIG. 3. Along section line 4—4, the first gate region is conductive and is represented by channel region 222 in FIG. 4. Along section line 5—5, the first gate region is non-conductive and is represented by non-conductive section 225 in FIG. 5. The second gate region is conductive along any section line in the direction of the channel length.

Non-conductive sections 225 reduce the effective channel width of the first gate region in structure 200. Therefore the current conducting capacity of the first gate region is smaller than that of the second gate region. By adjusting the number of non-conductive sections 225 and the width of each non-conductive section 225, the gate width of first gate structure 224 is adjusted independently of the gate width of second gate structure 226.

Although FIG. 3 shows that there are a plurality of non-conductive sections 225 formed in the first gate region, this is not intended as a limitation of the present invention. Structure 200 may include only one non-conductive section 225 in the first gate region. It should be understood that non-conductive sections 225 are not limited to being formed under first gate structure 224. For example, a dual gate FET may have nonconductive sections under its second gate, which results in the current conducting capacity of the first gate region of the dual gate FET being larger than the current conducting capacity of the second gate region. It should also be understood that the dopant concentration in the first gate region can be different from the dopant concentration of the second gate region. Likewise, the channel depth of the first gate region can be different from the channel depth of the second gate region. Therefore, the gate width and channel properties under each gate can be individually adjusted. Furthermore, structure 200 is not limited to including two gate structures as shown in FIGS. 3, 4, and 5. Structure 200 may be a multi-gate FET that includes more than two gate structures. Structure 200 may also be a single-gate FET that includes non-conductive sections 225 under its gate. In addition, structure 200 is not limited to having a single-fingered configuration. As those skilled in the art are aware, a multi-fingered multi-gate FET structure having individually adjustable gate widths can be developed from structure 200 of FIGS. 3, 4, and 5.

Figure 6:
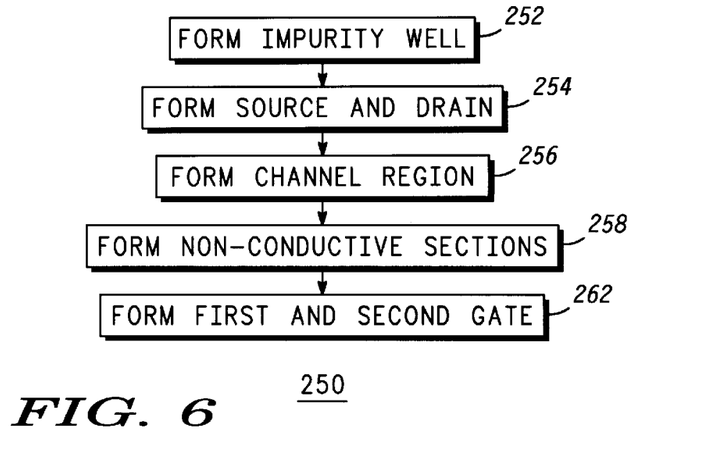
FIG. 6 is a flow chart of a method for making the field effect transistor structure of FIGS. 3–5 in accordance with yet another embodiment of the present invention.

FIG. 6 is a flow chart 250 of a method for making a FET device like structure 200 of FIGS. 3–5 in accordance with yet another embodiment of the present invention. Simultaneously referring to FIGS. 3–6 and starting with a substrate 210, an impurity well 214 is formed by either ion implantation or epitaxial growth (step 252). A source region 216 and a drain region 218 are formed in impurity well 214 (step 254). A channel region 222 is formed between source region 216 and drain region 218 (step 256) by a distance which is referred to as the channel length. A dimension of channel region 222 in the direction perpendicular to the direction of the channel length is referred to as the channel width. The formation of the source, drain, and channel regions are well known to those skilled in the art.

Channel region 222 is partitioned into a first gate region and a second gate region. In the first gate region, a plurality of non-conductive sections 225 are formed (step 258). Non-conductive sections 225 may be formed using ion implantation to render the semiconductor material in sections 225 non-conductive. A masking layer is formed on major surface 212 to protect the region of the semiconductor material outside non-conductive sections 225. The masking layer has openings at the locations where non-conductive sections 225 are to be formed. Structure 200 is then placed in an ion implant apparatus. Ions are injected from the ion implant apparatus into substrate 210 through the opening in the masking layer. Alternatively, non-conductive sections 225 may be formed by etching to remove the semiconductor material from sections 225.

After forming non-conductive sections 225, a first gate structure 224 and a second gate structure 226 are formed on major surface 212 above the first gate region and the second gate region, respectively (step 262). First gate structure 224, second gate structure 226, source region 216, and drain region 218 are then coupled to their respective probe pads.

Figure 7:
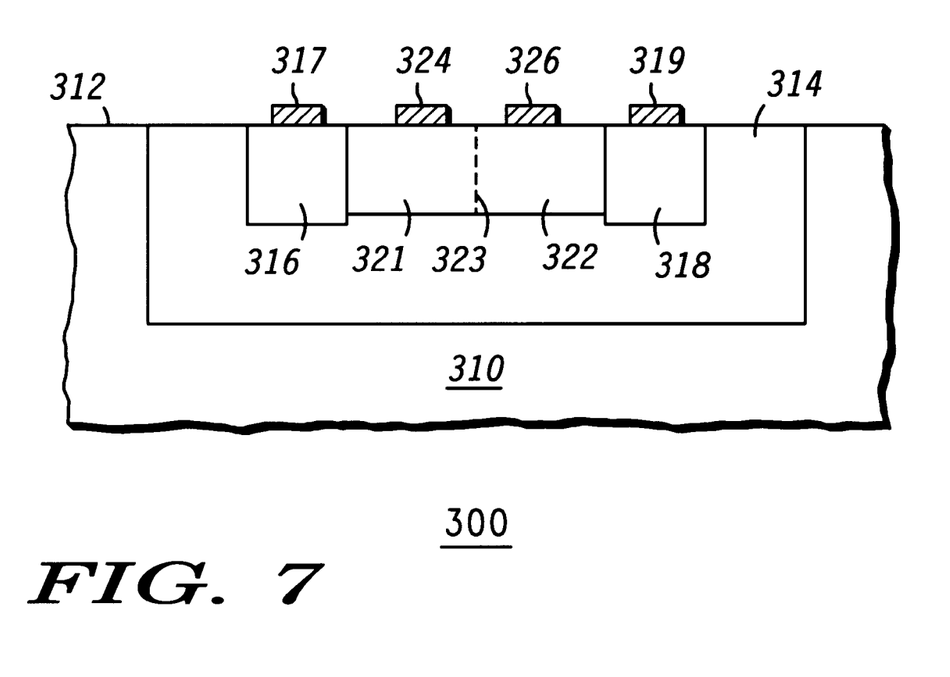
FIG. 7 a cross-sectional view of a field effect transistor structure in accordance with yet another embodiment of the present invention.

FIG. 7 is a cross-sectional view of a field effect transistor structure 300 in accordance with yet another embodiment of the present invention. Structure 300 includes a body of semiconductor material or substrate 310 having a major surface 312. An impurity well 314 extends into substrate 310 from major surface 312. By way of example, substrate 310 is semi-insulating gallium arsenide and impurity well 314 is a gallium arsenide semiconductor of p-type conductivity. Impurity well 314 has a dopant concentration typically on the order of $10^{14}$ to $10^{16}$ atoms/cm$^3$ and extends into substrate 310 to a depth of about 0.1 µm to about 0.6 µm. Impurity well 314 serves to improve the confinement of a channel region between a source region 316 and a drain region 318. It should be noted that, although preferred, impurity region 314 is optional in structure 300.

Source region 316 and drain region 318 extend from major surface 312 into impurity well 314 to a junction depth of, for example, 0.1 µm to about 0.5 µm, and typically have an n-type dopant concentration on the order of $10^{18}$ to $10^{19}$ atoms/cm$^3$. A source electrode 317 and a drain electrode 319 are on major surface 312 above source region 316 and drain region 318, respectively.

A channel region separates source region 316 from drain region 318. By way of example, the channel region is a gallium arsenide semiconductor of n-type conductivity and extends into substrate 310 to a channel depth of about 0.1 µm to about 0.3 µm. A distance from source region 316 to drain region 318 is referred to as a channel length of the channel region. In the direction of the channel length, the channel region is confined by two boundaries which are perpendicular to major surface 312 and contiguous with source region 316 and drain region 318. A dimension of the channel region in the direction perpendicular to the direction of the channel length is referred to as the channel width. In the direction of the channel width, the channel region is confined by two boundaries which are perpendicular to major surface 312 and coincide with the boundaries of impurity well 314.

The channel region is partitioned into two portions. A first portion is referred to as a first gate region 321 and a second portion is referred to as a second gate region 322. Each gate region is enclosed by two boundaries of the channel region in the direction of the channel width and by two borders in the direction of the channel length. The first border of first gate region 321 is contiguous with source region 316. The second border of first gate region 321 and the first border of second gate region 322 coincide with each other and are represented by a border line 323. The second border of second gate region 322 is contiguous with drain region 318. Second gate region 322 has a dopant concentration different from the dopant concentration of first gate region 321. By way of example, the dopant concentration of first gate region 321 is approximately $8.0 \times 10^{16}$ atoms/cm$^3$ and the dopant concentration of second gate region 322 is approximately $2.0 \times 10^{17}$ atoms/cm$^3$. Thus, first gate region 321 is in an enhancement mode and second gate region 322 is in a depletion mode. Different dopant concentrations in different gate regions can be achieved through either ion implantation or epitaxial growth.

A first gate structure 324 is formed on major surface 312 above first gate region 321 and a second gate structure 326 is formed on major surface 312 above second gate region 322. The gate widths of first gate structure 324 and second gate structure 326 are determined by the channel widths of first gate region 321 and second gate region 322, respectively.

It should be understood that non-conductive sections like non-conductive sections 225 in structure 200 of FIG. 3 can be formed in first gate region 321, second gate region 322, or both, to individually adjust the gate width of each gate. It should also be understood that the channel depth of first gate region 321 can be different from the channel depth of second gate region 322. Therefore, the gate width and channel properties under each gate can be individually adjusted. Furthermore, structure 300 is not limited to including two gate structures as shown in FIG. 7. Structure 300 may be a multi-gate FET that includes more than two gate structures. In addition, structure 300 is not limited to having a single-fingered configuration. A multi-fingered multi-gate FET structure having individually adjustable channel properties under each gate can be developed from structure 300 of FIG. 7.

Figure 8:
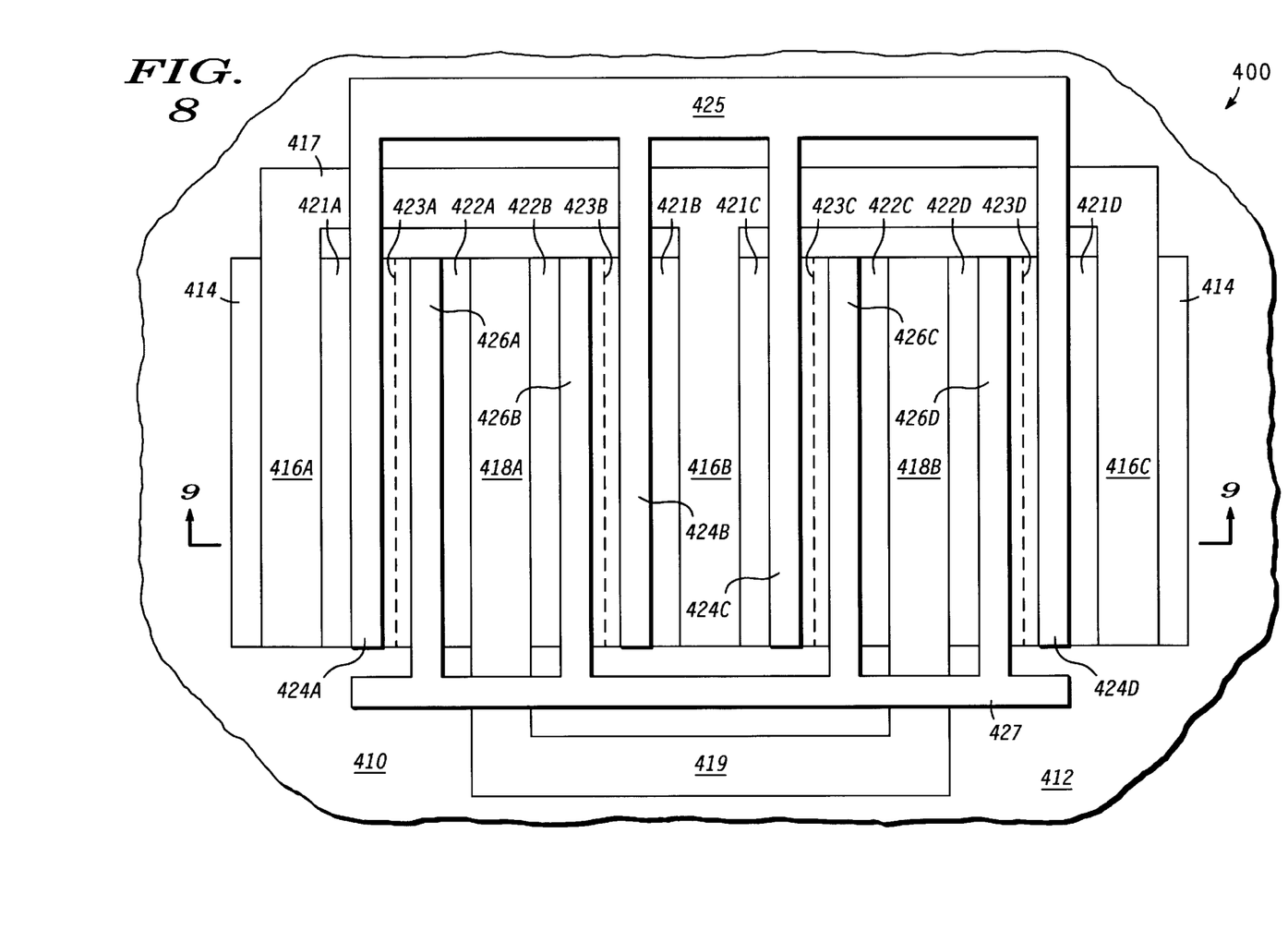
FIG. 8 is a top view of a multi-fingered field effect transistor structure in accordance yet another embodiment of with the present invention.

FIG. 8 is a top view of a multi-fingered field effect transistor structure 400 in accordance yet another embodiment of with the present invention. Structure 400 includes a body of semiconductor material or substrate 410 having a major surface 412. An impurity well 414 extends into substrate 410 from major surface 412. By way of example, substrate 410 is semi-insulating gallium arsenide and impurity well 414 is a gallium arsenide semiconductor of p-type conductivity. Impurity well 414 has a dopant concentration typically on the order of $10^{14}$ to $10^{16}$ atoms/cm$^3$ and extends into substrate 410 to a depth of about 0.1 μm to about 0.6 μm. Like impurity well 214 in structure 200 of FIG. 3 and impurity well 314 in structure 300 of FIG. 7, impurity well 414 is optional in structure 400.

Structure 400 further includes source finger regions 416A, 416B, and 416C and drain finger regions 418A and 418B, all extending into impurity well 414 from major surface 412. Source finger regions 416A–416C are commonly coupled to a source probe pad 417. Drain finger regions 418A and 418B are commonly coupled to a drain probe pad 419. Source finger regions 416A–416C and drain finger regions 418A–418B typically extend into impurity well 414 to a junction depth of about 0.1 μm to about 0.5 μm and have an n-type dopant concentration on the order of $10^{18}$ to $10^{19}$ atoms/cm$^3$.

A plurality of channel regions separate source finger regions 416A–416C from corresponding drain finger regions 418A–418B. By way of example, the channel regions are gallium arsenide semiconductor of n-type conductivity and have a dopant concentration typically on the order of $10^{16}$ to $10^{18}$ atoms/cm$^3$. A distance from a source finger region, 416A–416C, to a corresponding drain finger region, 418A–418B, is referred to as a channel length of a corresponding channel region. In the direction of the channel length, the channel region is confined by two boundaries which are perpendicular to major surface 412 and contiguous with the corresponding source finger region, 416A–416C, and drain finger region, 418A–418B. A dimension of the channel region in the direction perpendicular to the direction of the channel length is referred to as the channel width. In the direction of the channel width, the channel region is confined by two boundaries which are perpendicular to major surface 412 and coinciding with the boundaries of impurity well 414.

Each channel region is partitioned into two portions. A first portion of each channel region is referred to as a first gate region such as first gate regions 421A, 421B, 421C, and 421D. A second portion of each channel region is referred to as a second gate region such as second gate regions 422A, 422B, 422C, and 422D. Each gate region, 421A–421D or 422A–422D, is enclosed by two boundaries of the corresponding channel region in the direction of the channel width and by two borders in the direction of the channel length. The first border of first gate region 421A is contiguous with source finger region 416A. The second border of first gate region 421A and the first border of second gate region 422A coincide with each other and are represented by a border line 423A. The second border of second gate region 422A is contiguous with drain region 418A. Likewise, the first border of first gate region 421B is contiguous with source finger region 416B. The second border of first gate region 421B and the first border of second gate region 422B coincide with each other and are represented by a border line 423B. The second border of second gate region 422B is contiguous with drain region 418A. The first border of first gate region 421C is contiguous with source finger region 416B. The second border of first gate region 421C and the first border of second gate region 422C coincide with each other and are represented by a border line 423C. The second border of second gate region 422C is contiguous with drain region 418B. The first border of first gate region 421D is contiguous with source finger region 416C. The second border of first gate region 421D and the first border of second gate region 422D coincide with each other and are represented by a border line 423D. The second border of second gate region 422D is contiguous with drain region 418B.

Figure 9:
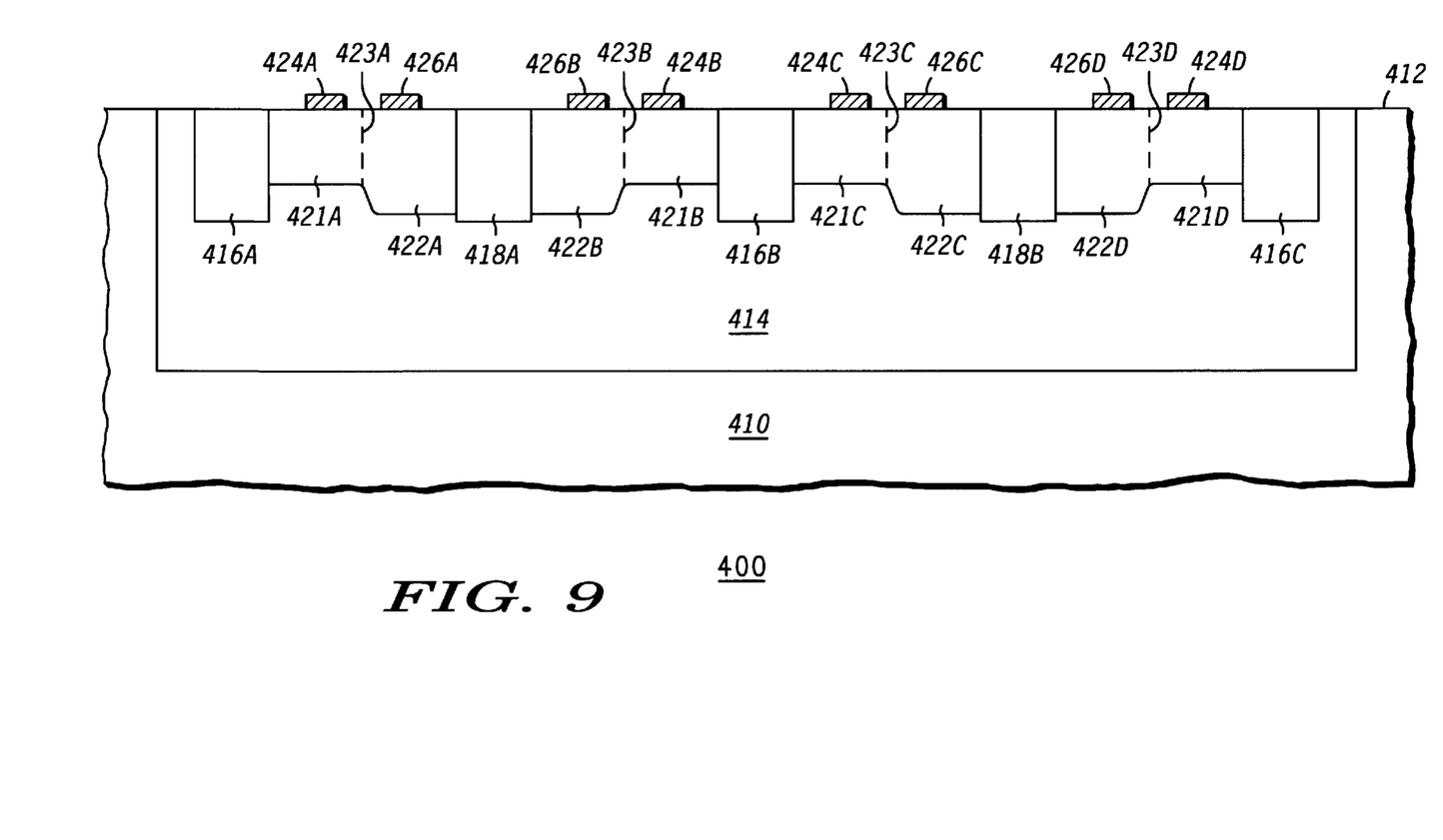
FIG. 9 is a cross-sectional view along section line 9—9 of FIG. 8.

Referring to FIG. 9 which is a cross-sectional view along section line 9—9 of FIG. 8, first gate regions 421A–421D have a channel depth different from the channel depth of second gate regions 422A–422D. By way of example, the channel depth of first gate region 421A–421B is approximately 0.15 μm and the channel depth of second gate region 422A–422B is approximately 0.20 μm. Thus, first gate regions 421A–421D have a smaller saturation voltage than second gate regions 422A–422D. Different channel depths in different gate regions can be achieved through either ion implantation or epitaxial growth. For ion implantation, the energy of implanted ions determines the channel depth. For epitaxial growth, different channel depths in different gate regions are achieved using selective etching.

Referring again to FIG. 8, first gate fingers 424A, 424B, 424C, and 424D are formed on major surface 412 above first gate regions 421A, 421B, 421C, and 421D, respectively. First gate fingers 424A–424D are also coupled to a first gate probe pad 425. The gate width of the first gate of structure 400 is determined by the total channel width of first gate regions 421A–421D. Likewise, second gate fingers 426A, 426B, 426C, and 426D are formed on major surface 412 above second gate regions 422A, 422B, 422C, and 422D, respectively. Second gate fingers 426A–426D are also coupled to a second gate probe pad 427. The gate width of the second gate of structure 400 is determined by the total channel width of second gate regions 422A–422D.

It should be understood that non-conductive sections like non-conductive sections 225 in structure 200 of FIG. 3 can be formed in first gate regions 421A–421D, second gate regions 422A–422D, or both, to individually adjust the gate width of each gate. It should also be understood that the dopant concentration of first gate regions 421A–421D can be different from the dopant concentration of second gate regions 422A–422D. Therefore, the gate width and channel properties under each gate can be individually adjusted. Furthermore, structure 400 is not limited to including two gate structures as shown in FIGS. 8 and 9. Structure 400 may be a multi-gate FET that includes more than two gate structures.

It should be noted that the FET structures described with reference to FIGS. 3, 7, and 8 are not limited to gallium arsenide FET structures. They are equally applicable to insulated gate FET (IGFET) structures. For an IGFET, the gate is separated from the major surface of the body of semiconductor material by a gate dielectric layer. In addition, for an n-channel IGFET, the source and drain regions have an n-type conductivity and the channel region has a p-type conductivity; and for a p-channel IGFET, the source and drain regions have a p-type conductivity and the channel region has an n-type conductivity.

By now it should be appreciated that a downconverter and a method for generating an IF signal have been provided. The LNA and the mixer in the downconverter of the present invention are coupled in a single DC path, thereby reducing the power consumption. In a preferred embodiment of the present invention, the mixer is a dual gate FET with independently adjustable gate width and channel properties. The dual gate FET uses less chip area than two FETs in a cascode configuration. Furthermore, the parameters such as gate width, dopant concentration, and channel depth, under each gate of the dual gate FET are individually adjusted for optimum performance. Therefore, the dual gate FET structure of the present invention can be tailored to provide superior performance over the prior art dual gate FET structures in high frequency signal mixing as well as other applications such as high frequency signal amplification.

What is claimed is:

1. A field effect transistor structure, comprising:
   a body of semiconductor material having a major surface;
   a source region formed in the body of semiconductor material extending from the major surface;
   a drain region formed in the body of semiconductor material extending from the major surface;
   a channel region having a first type of conductivity formed in the body of semiconductor material separating the source region from the drain region, wherein the channel region has a first boundary perpendicular to the major surface and contiguous with the source region, a second boundary parallel to the first boundary and contiguous with the drain region, a third boundary perpendicular to the major surface and perpendicular to the first boundary, and a fourth boundary parallel to the third boundary;
   a first portion of the channel region enclosed by a first border parallel to the first boundary of the channel region, a second border parallel to the second boundary of the channel region, the third boundary of the channel region, and the fourth boundary of the channel region;
   a second portion of the channel region enclosed by a first border parallel to the first boundary of the channel region, a second border parallel to the second boundary of the channel region, the third boundary of the channel region, and the fourth boundary of the channel region;
   a non-conductive section formed in the body of semiconductor material extending from the major surface and enclosed by a first edge coinciding with the first border of the first portion of the channel region, a second edge coinciding with the second border of the first portion of the channel region, a third edge parallel to the third boundary of the channel region, and a fourth edge parallel to the fourth boundary of the channel region, wherein the third and fourth edges are located between the third and fourth boundaries of the channel region;
   a first gate structure formed on the major surface above the first portion of the channel region; and
   a second gate structure formed on the major surface above the second portion of the channel region.

2. The field effect transistor structure of claim 1, wherein the second portion of the channel region is between the first portion of the channel region and the drain region.

3. The field effect transistor structure of claim 1, wherein the first portion of the channel region has a first dopant concentration and the second portion of the channel region has a second dopant concentration, and wherein the first dopant concentration is different from the second dopant concentration.

4. The field effect transistor structure of claim 1, wherein the first portion of the channel region extends from the major surface to a first channel depth and the second portion of the channel region extends from the major surface to a second channel depth, and wherein the first channel depth is different from the second channel depth.

5. A multi-gate field effect transistor structure, comprising:
   a body of semiconductor material having a major surface;
   a source region formed in the body of semiconductor material extending from the major surface;
   a drain region formed in the body of semiconductor material extending from the major surface;
   a channel region having a first type of conductivity formed in the body of semiconductor material separating the source region from the drain region, wherein the channel region has a first boundary perpendicular to the major surface and contiguous with the source region, a second boundary parallel to the first boundary and contiguous with the drain region, a third boundary perpendicular to the major surface and perpendicular to the first boundary, and a fourth boundary parallel to the third boundary;
   a first gate region having a first dopant concentration and the first type of conductivity formed in the channel region extending from the major surface, wherein the first gate region is enclosed by a first border parallel to the first boundary of the channel region, a second border parallel to the second boundary of the channel region, the third boundary of the channel region, and the fourth boundary of the channel region;
   a first gate formed on the major surface above the first gate region;
   a second gate region having a second dopant concentration and the first type of conductivity formed in the channel region, outside the first gate region, and extending from the major surface; and
   a second gate formed on the major surface above the second gate region.

6. The multi-gate field effect transistor structure of claim 5, further comprising a plurality of non-conductive sections formed in the first gate region, each non-conductive section of the plurality of non-conductive sections enclosed by a first edge coinciding with the first border of the first gate region, a second edge coinciding with the second border of the first gate region, a third edge parallel to the third boundary of the channel region, and a fourth edge parallel to the fourth boundary of the channel region.

7. The multi-gate field effect transistor structure of claim 5, wherein the second gate region is between the first gate region and the drain region.

8. The multi-gate field effect transistor structure of claim 5, wherein the first gate region extends from the major surface to a first channel depth and the second gate region extends from the major surface to a second channel depth, and wherein the first channel depth is different from the second channel depth.

9. A multi-fingered field effect transistor structure, comprising:

a body of semiconductor material having a major surface;

a plurality of source regions formed in the body of semiconductor material extending from the major surface, wherein the plurality of source regions are commonly coupled to a source probe pad;

a plurality of drain regions formed in the body of semiconductor material extending from the major surface, wherein the plurality of drain regions are commonly coupled to a drain probe pad;

a plurality of channel regions having a first type of conductivity formed in the body of semiconductor material separating the plurality of source regions from the plurality of drain regions, wherein a channel region of the plurality of channel regions has a first boundary perpendicular to the major surface and contiguous with a corresponding source region of the plurality of source regions, a second boundary parallel to the first boundary and contiguous with a corresponding drain region the plurality of drain regions, a third boundary perpendicular to the major surface and perpendicular to the first boundary, and a fourth boundary parallel to the third boundary;

a plurality of first gate regions having the first type of conductivity formed in the plurality of channel regions extending from the major surface to a first channel depth, wherein each first gate region of the plurality of first gate regions is enclosed by a first border parallel to the first boundary of a corresponding channel region of the plurality of channel regions, a second border parallel to the second boundary of the corresponding channel region, the third boundary of the corresponding channel region, and the fourth boundary of the corresponding channel region;

a plurality of second gate regions having the first type of conductivity formed in the plurality of channel regions, outside the plurality of first gate regions, and extending from the major surface to a second channel depth;

a plurality of first gates formed on the major surface above the plurality of first gate regions, wherein the plurality of first gates are commonly coupled to a first gate probe pad; and a plurality of second gates formed on the major surface above the plurality of second gate regions, wherein the plurality of second gates are commonly coupled to a second gate probe pad.

10. The multi-fingered field effect transistor structure of claim 9, further comprising a plurality of non-conductive sections formed in the plurality of first gate regions and extending from the major surface to the first channel depth, each non-conductive section of the plurality of non-conductive sections enclosed by a first edge coinciding with the first border of a corresponding first gate region of the plurality of first gate regions, a second edge coinciding with the second border of the corresponding first gate region, a third edge parallel to the third boundary of a corresponding channel region of the plurality of channel regions, and a fourth edge parallel to the fourth boundary of the corresponding channel region.

11. The multi-fingered field effect transistor structure of claim 9, wherein each second gate region of the plurality of second gate regions is between a corresponding first gate region of the plurality of first gate regions and a corresponding drain region of the plurality of drain regions.

12. The multi-fingered field effect transistor structure of claim 9, wherein the plurality of first gate regions have a first dopant concentration and the plurality of second gate regions have a second dopant concentration, and wherein the first dopant concentration is different from the second dopant concentration.

* * * * *